US006855399B2

(12) United States Patent
Sumi et al.

(10) Patent No.: US 6,855,399 B2
(45) Date of Patent: Feb. 15, 2005

(54) COPPER PASTE AND WIRING BOARD USING THE SAME

(75) Inventors: Hiroshi Sumi, Aichi (JP); Hidetoshi Mizutani, Aichi (JP); Manabu Sato, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/620,595

(22) Filed: Jul. 17, 2003

(65) Prior Publication Data

US 2004/0013860 A1 Jan. 22, 2004

(30) Foreign Application Priority Data

Jul. 17, 2002 (JP) ......................................... 2002-208322
Jul. 17, 2002 (JP) ......................................... 2002-208323

(51) Int. Cl.$^7$ .............................. B32B 9/00; B32B 3/00; H01B 1/02
(52) U.S. Cl. ..................... 428/209; 428/325; 428/469; 252/512; 252/513; 252/514; 252/518.1
(58) Field of Search ................................. 428/209, 469, 428/325, 323; 252/512, 513, 514, 518.1

(56) References Cited

U.S. PATENT DOCUMENTS

| 4,070,518 A | * | 1/1978 | Hoffman ..................... 428/209 |
| 4,789,411 A | * | 12/1988 | Eguchi et al. ................. 148/24 |
| 5,287,620 A | * | 2/1994 | Suzuki et al. .................. 29/852 |
| 5,336,444 A |   | 8/1994 | Casey et al. |
| 5,468,445 A |   | 11/1995 | Casey et al. |
| 5,514,326 A | * | 5/1996 | Tani et al. ...................... 419/9 |
| 6,156,237 A | * | 12/2000 | Kubota et al. ............... 252/512 |
| 6,489,014 B2 | * | 12/2002 | Tomiyama et al. ......... 428/209 |

FOREIGN PATENT DOCUMENTS

| JP | 63131405 A | * | 6/1988 |
| JP | 5-081922 |   | 4/1993 |
| JP | 05081922 A | * | 4/1993 |
| JP | 6-56545 |   | 3/1994 |
| JP | 11-16418 |   | 1/1999 |
| JP | 11-53940 |   | 2/1999 |

* cited by examiner

*Primary Examiner*—Stephen Stein
(74) *Attorney, Agent, or Firm*—Sughrue Mion, PLLC

(57) ABSTRACT

A wiring board obtained by filling a copper paste in a via hole formed on a ceramic green sheet and firing it to form an insulating layer and a via conductor, the copper paste comprising a copper powder, an organic vehicle and at least one selected from the group consisting of: a ceramic particle having an average particle size of 100 nm or less; and an $Fe_2O_3$ particle, wherein the copper paste comprises from 6 to 20 parts by mass of the organic vehicle per 100 parts by mass of the copper powder.

26 Claims, 2 Drawing Sheets

COPPER PASTE AND WIRING BOARD USING THE SAME

FIELD OF THE INVENTION

The present invention relates to a copper paste which is filled in a via hole formed on a ceramic green sheet and simultaneously fired, and a wiring board using the copper paste. More specifically, the present invention relates to a copper paste for use in a wiring board where a circuit component such as semiconductor element is enclosed inside a stacked body, and also relates to a wiring board using the copper paste. The wiring board is preferably produced by low temperature co-fired ceramics (LTCC). The wiring board of the invention preferably requires airtightness so as to insulate the circuit component from the outside air

BACKGROUND OF THE INVENTION

In recent years, accompanying the speeding up of information communication, the wiring board is used in a high frequency region of GHz band or more and demanded to be reduced in the transmission loss. To satisfy this requirement, the wiring board is produced by forming a conductor layer composed of a metal having a low conductor resistance and a low melting point, such as silver and copper, on a ceramic substrate having a relatively low dielectric constant. Also, with the progress of high-density packaging or multilayer formation of a circuit, a wiring board having a conductor layer or a via conductor formed by using copper more excellent in the migration resistance than silver is demanded.

In producing a multilayer wiring board, a ceramic layer and a conductor layer are alternately stacked and the conductor layers superposed one on another through a ceramic layer are connected by a via conductor formed to pierce the ceramic layer.

For producing a wiring board by using copper in the conductor layer or via conductor, the organic components must be removed with good efficiency while preventing the oxidation of copper. As the method for realizing this, for example, firing in a wet nitrogen atmosphere (in a mixed atmosphere of water vapor and nitrogen) is known.

More specifically, according to this method, a slurry is prepared using a ceramic raw material powder and an organic binder, a solvent or the like and formed into a ceramic green sheet by a sheet-forming method such as doctor blade method. Thereafter, a via hole is formed on this ceramic green sheet and a copper paste is filled in this via holes and dried to form a via conductor before firing. Furthermore, a conductor lay r working out to a wiring pattern is printed on the ceramic green sheet surface by using a copper paste and dried to form a ceramic green sheet where the via conductor and the conductor layer are connected. Subsequently, a plurality of ceramic green sheets are stacked to form a stacked body and this stacked body is debindered at a temperature of hundreds of ° C. in a mixed atmosphere of water vapor and nitrogen gas to remove organic components contained in the copper paste and ceramic green sheet and then fired by elevating the temperature to nearly 1,000° C. or more. As a result, the conductor layers stacked through a ceramic layer are connected by the via conductor and a multilayer wiring board is produced.

The thus-produced wiring board readily encounters a problem of protrusion that since the firing temperature and the firing shrinkage timing at the firing step differ between the copper working out to a via conductor and the ceramic layer working out to an insulting layer, the via conductor after the firing protrudes from the wiring board surface. As a technique for improving this problem, a copper metallizing composition and a glass ceramic wiring board using the composition disclosed in JP-A-11-53940 (the term "JP-A" as used herein means an "unexamined published Japanese patent application") are known.

In the copper metallizing composition and the glass ceramic wiring board using the composition described in JP-A-11-53940, the glass ceramic porcelain and the copper metallizing composition are matched in the firing shrinkage behavior to reduce the protrusion of the via conductor from the glass ceramic wiring board surface, where the copper metallizing composition which is used for a via hole comprises from 2 to 20 parts by weight of an $SiO_2$—$Al_2O_3$—RO(R: alkaline earth metal)—$B_2O_3$ based glass frit having a glass transition point of 700 to 750° C. per 100 parts by weight of the copper powder as the main component and the glass ceramic wiring board is obtained by using this copper metallizing composition and firing it simultaneously with a glass ceramic porcelain at a temperature of 700 to 1,000° C.

In the case of enclosing a circuit component such as semiconductor inside the stacked body, a semiconductor element is disposed on the top surface of the wiring board produced above and connected and subsequently, a cover having formed on the bottom surface thereof a housing hole for housing the semiconductor element is formed to cover the semiconductor element.

In using the thus-produced wiring board as a semiconductor package by enclosing a semiconductor, it is important for maintaining stable electric properties to isolate the semiconductor element from the outside water vapor or gas and ensure airtightness. In order to realize this, the interface between a via conductor and a ceramic layer must be prevented from the generation of clearance.

If clearance is generated at the interface between a via conductor and a ceramic layer of a wiring board, when the top surface of ceramic layer or the top surface of via conductor is plated, the plating solution may permeate inside the wiring board through the clearance to damage the wiring circuit. Also for eliminating this problem, the interface between a via conductor and a ceramic layer must be prevented from the generation of clearance.

As a technique for preventing the generation of clearance between a via conductor and a ceramic layer and suppressing the protrusion of a via conductor, a copper metallizing composition and a glass ceramic wiring board using the composition disclosed in JP-A-11-16418 and a metal-containing paste composition for via and a firing method therefor disclosed in JP-A-6-56545 are known.

In the copper metallizing composition and the glass ceramic wiring board using the composition described in JP-A-11-16418, a copper paste having added thereto a glass frit having a softening point of 700 to 1,000° C. is filled in a via hole and fired together with the glass ceramic porcelain at a temperature of 800 to 1,000° C., whereby the adhesive strength between the ceramic porcelain and the via conductor is enhanced to eliminate clearance and at the same time, the protrusion of via conductor is reduced.

In the metal-containing paste composition for via and the firing method therefor disclosed in JP-A-6-56545, this paste composition and a paste composition comprising an electrically conducting first metal, an oxidizable second metal and an organic medium are filled in a via hole and the ceramic porcelain is fired, whereby the clearance between the ceramic porcelain and the via conductor is eliminated.

SUMMARY OF THE INVENTION

As the downsizing of wiring board and the speeding up of transmission signal proceed, a free chip structure is demanded, where plating is applied to a via conductor exposed on the wiring board to form a circuit terminal and the terminal of a semiconductor is superposed on this circuit terminal and directly bonded thereto by soldering.

However, according to the copper metallizing composition and the glass ceramic wiring board disclosed in JP-A-11-53940, a glass frit is added to the copper metallizing composition and therefore, the glass readily comes up to the via conductor surface and remains there, giving rise to a problem that in the case of plating the via hole electrode surface and forming a wiring circuit thereon, the plating treatment becomes difficult.

An object of the present invention is to solve these problems and provide a copper paste and a wiring board using the copper paste, which can, in the wiring board using copper for the via conductor, reduce the protrusion of via conductor by firing and facilitate the plating treatment due to no coming up of glass to the via conductor surface.

According to the copper metallizing composition and the glass ceramic wiring board disclosed in JP-A-11-16418, a glass flit is added to the copper metallizing composition and therefore, the glass readily comes up to the via conductor surface and remains there, giving rise to a problem that in the case of plating the via conductor surface and forming a wiring circuit thereon, the plating treatment becomes difficult.

Also, according to the metal-containing paste composition for via and the firing method therefor disclosed in JP-A-6-56545, the metal-containing paste for via contains an oxidizable second metal and therefore, high via conductor resistance results after firing, giving rise to a problem that when this via conductor is used for the transmission path of a high-frequency circuit, the transmission property deteriorates.

An object of the present invention is to solve these problems and provide a copper paste and a wiring board using the copper paste, which can, in the wiring board using copper for the via conductor, reduce the protrusion of via conductor, facilitate the plating treatment due to no coming up of glass to the via conductor surface and lower the internal resistance of via conductor, and preferably can ensure airtightness.

To achieve the above-described object, a copper paste of the invention contains a copper powder, an organic vehicle and at least one of: a ceramic particle having an average particle size of 100 nm or less; and an $Fe_2O_3$ particle, and contains from 6 to 20 parts by mass (weight) of the organic vehicle per 100 parts by mass of the copper powder.

The copper paste containing the ceramic particle having an average particle size of 100 nm or less (a first aspect of the invention) is filled in a via hole formed on a ceramic green sheet and fired together with the ceramic green sheet and this provides an operational effect that the obtained wiring board can be reduced in the protrusion of via conductor, free from the coming up of glass to the via conductor surface and facilitated in the plating treatment.

The reason why the copper past of the first aspect can be suppressed from the protrusion of via conductor of a wiring board even if a glass flit is not contained is described below.

In general, the protrusion of via conductor is known to occur due to disagreement in the sintering behavior between the via conductor and the low-temperature firing porcelain. That is, the copper powder which is fired to form a via conductor starts sintering faster but finishes sintering later than the low-temperature firing porcelain and therefore, the protrusion of via conductor is readily generated. Accordingly, in order to reduce the protrusion of via conductor, an additive having both an effect of retarding the initiation of sintering of the copper powder (sintering inhibitory effect) and an effect of, after the initiation of sintering, rapidly advancing the sintering to achieve densification (sintering acceleration effect) need be contained in the copper paste.

As an additive for this purpose, glass frit is conventionally known. At a temperature higher than the softening point, the glass frit is powder and provides an effect of inhibiting the sintering of via conductor, whereas at a softening point or more, the glass frit is fluidized and provides an effect of accelerating the sintering of via conductor. However, since a large amount of glass frit must be added so as to retard the initiation of sintering of the via conductor, glass comes up to the via conductor surface after firing and remains there and this makes it difficult to apply a plating treatment.

According to the copper paste of the first, a ceramic particle having an average particle size of 100 nm or less is added. This ceramic particle is uniformly dispersed around the copper powder, so that even by the addition in a small amount, the effect of inhibiting the sintering of via conductor can be brought out and at the same time, the via conductor can be rapidly sintered (densified) after the initiation of sintering and thereby suppressed from protruding. Furthermore, unlike the glass frit, the ceramic particle does not have fluidity and is contained in the dispersed state inside the via conductor, therefore, an inorganic matter mainly comprising a constituent portion (constituents) of additives such as glass frit does not come up to the via conductor surface to inhibit the plating treatment and an excellent wiring board facilitated in the plating treatment can be obtained.

The average particle size of the ceramic particle is preferably 100 nm, because with an average particle size of 100 nm or less, the ceramic particle is uniformly dispersed in the via conductor and good protrusion inhibitory effect can be attained. If the average particle size exceeds, the protrusion of via conductor is readily generated.

The average particle size of the ceramic particle is more preferably 50 nm or less, still more preferably 30 nm or less or 40 nm or less, because the protrusion inhibitory effect can be obtained even by the addition in a small amount, so that the ceramic component remaining within the via conductor can be decreased and the resistivity of via conductor can be reduced.

The ceramic particle having an average particle size of 100 nm or less contained in the copper paste of the present invention has an effect of retarding the initiation of sintering of the copper powder (sintering inhibitory effect) and an effect of, after the initiation of sintering, rapidly advancing the sintering to achieve densification (sintering acceleration effect). The ceramic particle having an average particle size of 100 nm or less and having an effect of elevating the sintering initiation temperature of copper powder is a ceramic particle having a high melting point, such as $Al_2O_3$, $TiO_2$, $ZrO_2$, $CeO_2$ and mullite. The ceramic particle having an average particle size of 100 nm or less and having an effect of enhancing the sinterability of copper is a glass-forming oxide such as $SiO_2$ and $B_2O_3$, an oxide of reacting with glass to form a liquid phase, such as MgO, CaO, $Na_2O$ and $K_2O$, or a low melting point metal oxide such as $Bi_2O_3$.

By the copper paste containing the $Fe_2O_3$ particle (a second aspect of the invention), a wiring board enhanced in the adhesion to a ceramic layer at the firing, free of clearance at the interface between the via conductor and the ceramic layer and having excellent airtightness can be obtained and an operational effect that an inorganic matter inhibiting the plating property less remains on the wiring board surface and the plating is easily performed can be obtained.

The reason why the airtightness of the wiring board is enhanced by adding an $Fe_2O_3$ particle to the copper paste is considered as follows.

In general, when the via conductor is insufficiently fired at the sintering in the production of a wiring board or clearance is generated at the interface between the via conductor and the ceramic layer, the airtightness of wiring board is impaired. The generation of clearance at the interface between the via conductor and the ceramic layer is considered to occur due to bad wettability of the copper metal for forming the via conductor to the liquid phase component in the low-temperature firing porcelain material for forming the ceramic layer. A method of improving the wettability by using an oxidized copper is known, however, according to this method, the sinterability of copper at the firing deteriorates.

Therefore, in the second aspect, an $Fe_2O_3$ particle is added in the copper paste, whereby the wettability to the liquid phase component in the low-temperature firing porcelain material is enhanced without impairing the sinterability of copper metal and the airtightness at the interface between the via conductor and the ceramic layer is improved.

When an $Fe_2O_3$ particle is added to the copper paste and the system is transferred to a temperature higher than 700° C. at the firing step, a chemical reaction takes place according to the following (1):

$$2Cu+3Fe_2O_3 \rightarrow Cu_2O+2Fe_3O_4 \qquad (1)$$

Namely, it is considered that the $Fe_2O_3$ acts as an oxidizing agent for Cu in the firing temperature region and slightly oxidizes the entire Cu.

At this time, the amount of Cu oxidized is very small but the entire Cu is uniformly oxidized, as a result, the wettability of the copper metal to the liquid phase component of the low-temperature firing porcelain material is enhanced throughout the interface of via conductor and the airtightness is improved. Also, since the amount of copper oxidized is very small, a dense sintered body is obtained without impairing the sinterability of copper.

The $Fe_2O_3$ particle is an iron oxide particle mainly comprising $Fe_2O_3$ and may contain an iron oxide (for example, $Fe_3O_4$ or FeO) other than $Fe_2O_3$, or a metal Fe.

The average particle size of the $Fe_2O_3$ particle is preferably 1 µm or less, more preferably 500 nm or less, still more preferably 100 nm or less, because if the average particle size exceeds 1 µm, $Fe_2O_3$ cannot be uniformly dispersed on the interface between the via conductor and the ceramic layer and the effect of improving the airtightness decreases.

The amount of the $Fe_2O_3$ particle added is preferably, in terms of Fe element, from 0.1 to 5.0 parts by mass, more preferably from 0.1 to 2.0 parts by mass or from 0.1 to 1.0 parts by mass, because if the amount added is less than 0.1 part by mass, the effect of improving the airtightness decreases, whereas if it exceeds 5.0 part by mass, the conductor resistance increases.

The organic vehicle content is specified to a range from 6 to 20 parts by mass per 100 parts by mass of the copper powder (preferably from 12 to 18 parts by mass), because if the organic vehicle content is less than 6 parts by mass, the fluidity of copper paste is impaired and filling failure in the via hole occurs, whereas if the organic vehicle content exceeds 20 parts by mass, when the copper paste is filled in the via hole and dried, the via conductor is disadvantageously formed in the receded shape from the ceramic green sheet surface.

The average particle size of the copper powder is preferably from 0.5 to 10 µm, more preferably from 2 to 5 µm or from 1 to 7 µm, because if the average particle size of the copper powder is less than 0.5 µm, the sintering initiation temperature of copper excessively decreases and the via conductor greatly protrudes, whereas if the average particle size of the copper powder exceeds 10 µm, the filling property in a small-size via hole is impaired and a via conductor having a dense sintered structure cannot be formed. The copper powder may have any shape such as nearly spherical, dendritic or flake form, but a nearly spherical copper powder is preferred, because this copper powder can be uniformly filled in the via hole and the protrusion of via conductor can be suppressed with good precision.

The copper paste of the present invention is preferably free from an alkali metal or alkaline earth metal compound, because if an alkali metal or alkaline earth metal compound is contained, this compound readily reacts with the composition of ceramic green sheet at the firing together with the ceramic green sheet to cause deterioration in the electrical properties such as dielectric loss.

The organic vehicle is obtained by dissolving an organic polymer in an organic solvent and at least one organic polymer such as ethyl cellulose, acrylic resin, polymethylstyrene, butyral resin, alkyd resin and polyalkylene carbonate is used therefor. In particular, an acrylic resin is preferred, and poly-n-butyl methacrylate and poly-2-ethylhexyl methacrylate are more preferred, because the decomposability at the firing is enhanced and a dense via conductor having low resistance can be obtained.

The organic solvent is preferably a high boiling point solvent such as terpineol, butylcarbitol acetate, butylcarbitol and dibutyl phthalate.

In the copper paste of the present invention, an inorganic additive may be contained so as to more improving the plating property of via conductor, and an organic additive such as plasticizer, thickening agent, leveling agent and defoaming agent may also be contained.

The copper paste of the invention preferably has a viscosity of 5,000 to 1,000,000 poises (500 to 100,000 pa.sec) at 23° C., more preferably 10,000 to 500,000 poises at 23° C., because if the viscosity is no less than 5,000 poises, when the copper paste is filled in a via hole and dried, the via conductor is not disadvantageously formed in the receded shape from the ceramic green sheet surface, whereas if the viscosity is no more than 1,000,000 poises, the fluidity of copper paste is not impaired and the case is prevented that this disadvantageously causes filling failure in the via hole. By adjusting the viscosity to fall in the above-described range, the copper paste can be filled in a via hole with good precision.

In the copper paste of the first aspect, the ceramic particle is preferably an $SiO_2$ particle having an average particle size of 100 nm or less.

When an $SiO_2$ particle is used as the ceramic particle having an average particle size of 100 nm or less, only by the addition in a very small amount of 0.1 to 5.0 parts by mass per 100 parts by mass of the copper powder, an effect of retarding the initiation of sintering of the copper powder (sintering inhibitory effect) and an effect of, after the initiation of sintering, rapidly advancing the sintering to achieve densification (sintering acceleration effect) can be exerted, as a result, the protrusion of via conductor can be more reduced, a dense via conductor having low resistance can be obtained and at the same time, a wiring board excellent in the soldering or plating property to the via conductor surface can be obtained.

The average particle size of the $SiO_2$ particle is preferably 50 nm or less, more preferably 40 nm or less, still more preferably 30 nm or less, because the effect of suppressing the protrusion can be obtained only by the addition in a small amount, so that the ceramic component remaining in the via conductor can be decreased and the resistivity of via conductor can be reduced.

The amount of the $SiO_2$ particle added is preferably from 0.1 to 5.0 parts by mass per 100 parts by mass of the copper powder, because if the amount of the $SiO_2$ particle added is less than 0.1 part by mass, the protrusion of via conductor increases, whereas if it exceeds 5.0 parts by mass, $SiO_2$ remains on the via conductor surface and the plating or soldering property is impaired.

The copper paste of the second aspect preferably comprises a ceramic particle having an average particle size of 100 nm or less, more preferably having 50 nm or less, still more preferably having 40 nm or less, and particularly preferably having 30 nm or less. This is because since a ceramic particle having an average particle size of 100 nm or less is added, the ceramic particle is uniformly dispersed in the periphery of copper powder and thereby the copper powder and the ceramic green sheet are approximated in the sintering temperature and sintering timing, as a result, the protrusion of via conductor from the top surface of the wiring board can be reduced. Furthermore, this ceramic particle has no fluidity unlike a glass frit and is contained in the dispersed state inside the via conductor, therefore, an inorganic matter inhibiting the plating treatment does not come up to the via conductor surface and a wiring board facilitated in the plating treatment is obtained.

On the other hand, if the average particle size of the ceramic particle exceeds 100 nm, the protrusion of via conductor is readily generated and this is not preferred.

The lower limit of the average particle size of the ceramic particle is not limited, but preferably 5 nm.

The ceramic particle having an average particle size of 100 nm or less has an effect of retarding the initiation of sintering of the copper powder (sintering inhibitory effect) and an effect of, after the initiation of sintering, rapidly advancing the sintering to achieve densification (sintering acceleration effect). The ceramic particle having an effect of retarding the initiation of sintering of copper is a ceramic particle having a high melting point, such as $Al_2O_3$, $TiO_2$, $ZrO_2$, $CeO_2$ and mullite. The ceramic particle having an effect of enhancing the sinterability of copper is a glass-forming oxide such as $SiO_2$ and $B_2O_3$, an oxide of reacting with glass to form a liquid phase, such as MgO, CaO, $Na_2O$ and $K_2O$, or a low melting point metal oxide such as $Bi_2O_3$.

The ceramic particle having an average particle size of 100 nm or less is preferably an $SiO_2$ particle, because only by the addition in a very small amount, the initiation of sintering of the copper powder is retarded and, after the initiation of sintering, the sintering is expedited and densification is achieved, as a result, the protrusion of via conductor can be more reduced, a dense via conductor having low resistance can be obtained and at the same time, a wiring board excellent in the soldering or plating property on the via conductor surface can be obtained.

The average particle size of the $SiO_2$ particle is preferably 50 nm or less, more preferably 40 nm or less, still more preferably 30 nm or less, because if the average particle size of the $SiO_2$ particle is no more than 50 nm, the protrusion of via conductor is not readily generated. The lower limit of the average particle size of the $SiO_2$ fine particle is not limited, but preferably, 5 nm.

The amount of the $SiO_2$ particle added is preferably from 0.1 to 5.0 parts by mass per 100 parts by mass of the copper powder, because if the amount of the $SiO_2$ particle added is no less than 0.1 part by mass, the protrusion of via conductor decreases, whereas if it is no more than 5.0 parts by mass, $SiO_2$ does not remain over the wide range on the via conductor surface and the plating or soldering property is not impaired.

A wiring board of the invention is obtained by filling a copper paste in a via hole formed on a ceramic green sheet and firing it to simultaneously form an insulating layer and a via conductor (simultaneous firing), the copper paste comprising a copper powder, an organic vehicle and at least one selected from the group consisting of: a ceramic particle having an average particle size of 100 nm or less; and an $Fe_2O_3$ particle, wherein the copper paste comprises from 6 to 20 parts by mass of the organic vehicle per 100 parts by mass of the copper powder.

According to the wiring board, the protrusion of via conductor after firing, the coming up of inorganic matter to the via conductor surface, and the like can be reduced and this provides an operational effect that a good plating film reduced in defects such as pinhole can be formed on the via conductor surface, the via conductor is densely sintered to have a low electrical resistance and when conductor layers (wiring patterns) or circuit components are connected by using this via conductor, a high frequency circuit reduced in the transmission loss can be formed.

In this wiring board, the via conductor is formed by using a copper paste capable of suppressing the protrusion of via conductor and this provides an operation effect that a circuit component can be packaged on a packaging terminal composed of the via conductor of the wiring board with high connection reliability or a wiring pattern can be formed on the via conductor with good precision.

Also, in this wiring board, a copper paste capable of ensuring dense firing of the via conductor and free from coming up of an inorganic matter to the via conductor surface to inhibit the plating is used and this provides an operational effect that the conductor resistance value of via conductor is low and the plating is facilitated, as a result, when the via conductor is used as a transmission path of a high-frequency signal, the transmission loss is reduced.

The wiring board obtained by the use of the copper paste comprising the ceramic particle having an average particle size of 100 nm or less (a third aspect of the invention) preferably comprises an inorganic matter mainly comprising constituents of the ceramic particle and having a size of 10 $\mu$m or less inside the via conductor. In this wiring board, the size of the inorganic matter present inside the via conductor is 10 $\mu$m or less and this provides an operational effect that even if a part of this inorganic matter is exposed to the via conductor surface, the via conductor surface is not impaired in the plating property and can be easily plated. The inorganic matter is resultant from the aggregation of ceramic particles previously contained in the copper paste or inorganic components contained in the ceramic green sheet and diffused in the via conductor. In the via conductor, this inorganic matter is present in the spherical, nearly spherical or amorphous shape. The form thereof is nearly circular in many cases and therefore, the long diameter thereof is taken as the size of the inorganic matter. In the case where the cross section of the inorganic matter is not circular, from the relationship of diameter (d) obtained by converting the area thereof into an area of a circle, namely, sectional area of inorganic matter=$\pi(d/2)^2$, d=$2\times$(sectional area of inorganic matter/$\pi)^{0.5}$ is used as the size of the inorganic matter.

In the wiring board of the third aspect, the size of the inorganic matter revealed on the via conductor surface is preferably 10 $\mu$m or less. The size of the inorganic matter revealed on the via conductor surface is 10 $\mu$m or less and this provides an operational effect that the plating property on the via conductor surface is not impaired and a plating film reduced in defects such as pinhole can be easily formed.

In the third aspect, the via conductor may be used as it is as a packaging terminal but may be constituted such that a packaging pad is formed thereon by a simultaneous firing method or a thick film method. The inorganic matter scarcely comes to diffuse on the packaging pad surface and a good plating film can be formed.

A fourth aspect of the invention is a wiring board comprising a via conductor having dispersed therein an inorganic matter, wherein in the cross section in the thickness direction of the wiring board, the total area of the inorganic matter having a particle size of 2 $\mu$m or more is 10% or less of the sectional area of the via conductor.

According to the wiring board of the fourth aspect, in the cross section in the thickness direction of the wiring board, the total area of the inorganic matter having a particle size of 2 $\mu$m or more dispersed in the via conductor is 10% or less of the sectional area of the via conductor and this provides an operational effect that even if a part of the inorganic matter is exposed to the via conductor surface, the via conductor surface is not impaired in the plating property and can be easily plated. In the via conductor, this inorganic matter is present in the spherical, nearly spherical or amorphous shape. The form thereof is nearly circular in many cases and therefore, the long diameter thereof may be taken as the size of the inorganic matter. In the case where the cross section of the inorganic matter is not circular, the diameter (d) obtained by converting the area thereof into an area of a circle, namely, d=$2\times$(sectional area of inorganic matter/$\pi)^{0.5}$ from the relationship of sectional area of inorganic matter=$\pi(d/2)^2$, is used as the size of the inorganic matter.

A fifth aspect of the invention is a wiring board comprising a via conductor having dispersed therein an inorganic matter, wherein in the cross section in the thickness direction of the wiring board, the total area of the inorganic matter having a particle size of 5 $\mu$m or more is 5% or less of the sectional area of the via conductor.

According to the wiring board of the fifth aspect, in the cross section in the thickness direction of the wiring board, the total area of the inorganic matter having a particle size of 5 $\mu$m or more dispersed in the via conductor is 5% or less of the sectional area of the via conductor and this provides an operational effect that even if a part of the inorganic matter is exposed to the via conductor surface, the via conductor surface is not impaired in the plating property and can be easily plated. In the via conductor, this inorganic matter is present in the spherical, nearly spherical or amorphous shape. The form thereof is nearly circular in many cases and therefore, the long diameter thereof may be taken as the size of the inorganic matter. In the case where the cross section of the inorganic matter is not circular, the diameter (d) obtained by converting the area thereof into an area of a circle, namely, d=$2\times$(sectional area of inorganic matter/$\pi)^{0.5}$ from the relationship of sectional area of inorganic matter=$\pi(d/2)^2$, is used as the size of the inorganic matter.

A sixth aspect of the invention is a wiring board comprising a via conductor having dispersed therein an inorganic matter, wherein in the cross section in the thickness direction of the wiring board, the total area of the inorganic matter having a particle size of 10 $\mu$m or more is 2% or less of the sectional area of the via conductor.

According to the wiring board of the sixth aspect, in the cross section in the thickness direction of the wiring board, the total area of the inorganic matter having a particle size of 10 $\mu$m or more dispersed in the via conductor is 2% or less of the sectional area of the via conductor and this provides an operational effect that even if a part of the inorganic matter is exposed to the via conductor surface, the via conductor surface is not impaired in the plating property and can be easily plated. In the via conductor, this inorganic matter is present in the spherical, nearly spherical or amorphous shape. The form thereof is nearly circular in many cases and therefore, the long diameter thereof may be taken as the size of the inorganic matter. In the case where the cross section of the inorganic matter is not circular, the diameter (d) obtained by converting the area thereof into an area of a circle, namely, d=$2\times$(sectional area of inorganic matter/$\pi)^{0.5}$ from the relationship of sectional area of inorganic matter=$\pi(d/2)^2$, is used as the size of the inorganic matter.

In the wiring boards of the third to sixth aspects, the via conductor is preferably exposed to at least one surface of the wiring board and a plating layer is preferably formed on the exposed face of the via conductor. An inorganic matter less remains on the via conductor surface and this provides an operational effect that the plating treatment is facilitated, a good plating layer free of plating unevenness or defects such as pinhole or separation can be formed and therefore, a packaged board having excellent durability such as temperature load, humidity load and heat load can be fabricated.

In the third to sixth aspects, the via conductor having formed thereon a plating layer may be used as it is as a packaging terminal but may be constituted such that a packaging pad is formed on the via hole and then a plating layer is formed thereon. The inorganic matter scarcely comes to diffuse on the packaging pad and a good plating film can be formed.

In the wiring boards of the third to sixth aspects, a semiconductor element is preferably mounted and the terminal of this semiconductor element is preferably connected to the via conductor through a joining member such as solder or brazing material. The via conductor is low in the conductor resistance and connected to the terminal of a semiconductor element through a joining member and this provides an operational effect that a wiring board having excellent reliability can be fabricated without causing dispersion or deterioration in the electrical properties of semiconductor.

In the wiring boards of the third to sixth aspects, the via conductor is preferably constituted as a thermal via working out to a heat conduction path. The via conductor is densely fired and elevated in the heat conductivity and this provides an operational effect that when the via conductor is constituted as a thermal via in a high-density packaging type wiring board, a wiring board having an excellent heat radiation effect can be obtained.

The wiring boards of the third to sixth aspects preferably comprise a via conductor having inside thereof an inorganic matter having a size of 10 $\mu$m or less. The size of the inorganic matter present inside the via conductor is 10 μm or less and this provides an operational effect that even if a part of the inorganic matter is revealed on the via conductor surface, the plating property of the via conductor surface is not impaired and the plating treatment can be easily performed. The inorganic matter is resultant from the aggregation of ceramic particles previously contained in the copper paste or inorganic components contained in the ceramic green sheet and diffused in the via conductor. In the via conductor, this inorganic matter is present in the spherical, nearly spherical or amorphous shape. The form thereof is nearly circular in many cases and therefore, the long diameter thereof is taken as the size of the inorganic matter. In the case where the cross section of the inorganic matter is not circular, from the relationship of diameter (d) obtained by converting the area thereof into an area of a circle, namely, sectional area of inorganic matter=$\pi(d/2)^2$, d=2×(sectional area of inorganic matter/$\pi$)$^{0.5}$ is used as the size of the inorganic matter.

The size of the inorganic matter revealed on the via conductor surface is preferably 10 μm or less. In this wiring board, the size of the inorganic matter revealed on the via conductor surface is 10 μm or less and this provides an operational effect that the plating property of the via conductor surface is not impaired and a plating film reduced in defects such as pinhole can be easily formed.

In the wiring board obtained by the use of the copper paste comprising the $Fe_2O_3$ particle (a seventh aspect of the invention), the via conductor preferably contains less than 5.0 parts by mass (excluding 0 part by mass) of an Fe element per 100 parts by mass of the copper powder (copper element). According to this wiring board, the via conductor contains a specified amount of Fe element and this provides an operational effect that good adhesion between via conductor and ceramic layer and high airtightness can be ensured without causing increase in the resistance value of via conductor. The Fe element content is preferably less than 5.0 parts by mass (excluding 0 part by mass) per 100 parts by mass of the copper powder, because if the content exceeds 5.0 parts by mass, the resistance value of via conductor elevates and the high-frequency signal transmission property deteriorates.

In the wiring board of the seventh aspect, the via conductor is preferably exposed to at least one surface of the wiring board and a plating layer is preferably formed on the exposed top face of the via conductor. According to this wiring board, an inorganic matter less remains on the via conductor surface and this provides an operational effect that the plating treatment is facilitated, the airtightness at the interface between ceramic layer and via conductor is ensured and the permeation of plating solution is thereby prevented, as a result, the properties of the wiring board are not impaired and a wiring board excellent in the durability such as temperature load, humidity load and heat load and in the airtightness can be formed. Furthermore, when the plating layer on the via conductor surface is used as a terminal electrode for the connection to a circuit component through a connecting member, this provides an operational effect that high packaging reliability can be obtained and the circuit component can be packaged at a high density.

According to this wiring board, the via conductor, the plating layer on the via conductor and the like can be formed to have a very small diameter, more specifically, a diameter of 250 μm, preferably 150 μm, more preferably 150 μm, can be easily obtained and this provides an operational effect that small-size wiring board, high-density packaging and high-speed signal transmission can be realized.

The plating treatment is performed to prevent the oxidation of copper for forming the via conductor and impart good soldering wettability and it is preferred to perform Ni plating and further perform Au plating on the top surface thereof.

The wiring board of the seventh aspect is preferably obtained by forming a via conductor containing less than 5.0 parts by mass (excluding 0 part by mass) of an Fe element per 100 parts by mass of a copper element (an eighth aspect of the invention).

According to the wiring board of the eighth aspect, the via conductor contains a specified amount of Fe element and this provides an operational effect that good adhesion between via conductor and ceramic layer and high airtightness can be ensured without causing increase in the resistance value of via conductor. The Fe element content is preferably less than 5.0 parts by mass (excluding 0 part by mass) per 100 parts by mass of the copper powder, because if the content exceeds 5.0 parts by mass, the resistance value of via conductor elevates and the high-frequency signal transmission property deteriorates.

In the wiring board of the eighth aspect, wherein the via conductor is preferably exposed to at least one surface of the wiring board and a plating layer is preferably formed on the exposed top face of the via conductor.

According to this wiring board, an inorganic matter less remains on the via conductor surface and this provides an operational effect that the plating treatment is facilitated, the airtightness at the interface between ceramic layer and via conductor is ensured and the permeation of plating solution is thereby prevented, as a result, the properties of the wiring board are not impaired and a wiring board excellent in the durability such as temperature load, humidity load and heat load and in the airtightness can be formed. Furthermore, when the plating layer on the via conductor surface is used as a terminal electrode for the connection to a circuit component through a connecting member, this provides an operational effect that high packaging reliability can be obtained and the circuit component can be packaged at a high density.

According to this wiring board, the via conductor, the plating layer on the via conductor and the like can be formed to have a very small diameter, more specifically, a diameter of 250 μm, even 100 μm or 150 μm, can be easily obtained and this provides an operational effect that small-size wiring board, high-density packaging and high-speed signal transmission can be realized.

The plating treatment is performed to prevent the oxidation of copper for forming the via conductor and impart good soldering wettability and it is preferred to perform Ni plating and further perform Au plating on the top surface thereof.

Figure 1:
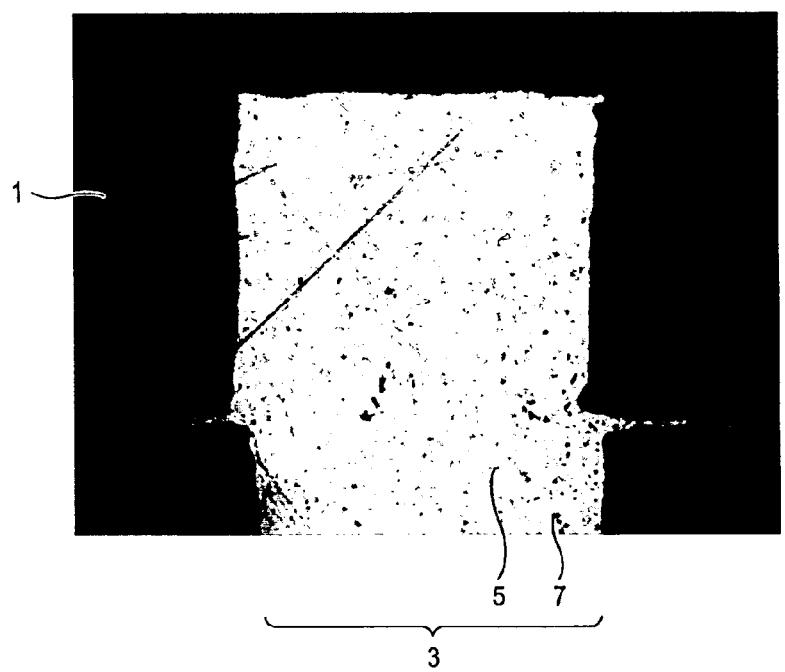
FIG. 1 is a cross-sectional view showing the cross section of a fired sample in one embodiment where the present invention is applied.

DESCRIPTION OF NUMERICAL REFERENCES 1 and 2: ceramic porcelain, 3 and 4: via conductor, 5 and 6: copper, 7 and 8: inorganic matter, 10: wiring board, 11 to 14: ceramic layer (insulating layer), 15: semiconductor element, 16: cover, 17: hole, 18 to 23: circuit terminal, 24 to 29: conductor layer, 30 to 35: plating layer, and 36 to 47: via conductor.

DETAILED DESCRIPTION OF THE INVENTION

Embodiment 1

The present invention is described below by referring to one embodiment.

[Production of Ceramic Green Sheet]

A mixed powder having a particle size of 2.5 μm and an alkali metal impurity content of 0.2 mol % or less was prepared by mixing 50 parts by mass of an alumina filler with a glass powder having a composition such that $SiO_2$ was 31.65 parts by mass, $B_2O_3$ was 12.05 parts by mass, $Al_2O_3$ was 2.85 parts by mass and CaO was 3.45 parts by mass.

Thereafter, 20 parts by mass of a binder comprising acrylic resin, 10 parts by mass of a plasticizer comprising dibutyl phthalate and an appropriate amount of a toluene-MEK mixed solvent were added per 100 parts by mass of the alumina and glass mixed powder to prepare a slurry.

The obtained slurry was formed into a ceramic green sheet having a thickness of 250 μm by a sheet formation method such as doctor blade method. This ceramic green sheet is a low-temperature firing green sheet which can be fired at a relatively low temperature (1,000° C. here).

[Production of Copper Paste]

Thereafter, 12 parts by mass of a vehicle and an additive shown in Table 1 were added to 100 parts by mass of a spherical copper powder having an average particle size of 5 μm and these were mixed by a three-roll mill to produce a copper paste. Incidentally, the vehicle was prepared by dissolving 30 parts by mass of polyisobutyl methacrylate in 70 parts by mass of terpineol.

of a vehicle is used, the viscosity is changed to 60,000 poise, and in case that 16 parts by mass of a vehicle is used, the viscosity is changed to 5,000 poise).

Example 1-A is a copper paste where 1.0 part by mass of $Al_2O_3$ having an average particle size of 13 nm was added as the ceramic particle.

Example 1-B is a copper paste where 1.0 part by mass of $TiO_2$ having an average particle size of 21 nm was added as the ceramic particle.

Examples 1-C to 1-F are copper pastes where $SiO_2$ having an average particle size of 12 nm was added as the ceramic particle and the amount of $SiO_2$ added was varied in the range from 0.2 to 2.0 parts by mass.

Examples 2-A to 2-F are copper pastes where $Fe_2O_3$ particle having an average particle size of 21 nm was added by varying the amount added in the range from 0.2 to 10.0 parts by mass per 100 parts by mass of the copper powder and $SiO_2$ particle having an average particle size of 12 nm was further added. Assuming that the Cu element is 100 parts by mass, the parts by mass of Fe element was calculated from the copper paste composition and shown as Fe Element (parts by mass) in Table 1.

Comparative Example 1-A is a copper paste where no additive was added.

Comparative Example 1-B is a copper paste where 1.0 part by mass of $Al_2O_3$ having an average particle size of 300 nm was added as the ceramic particle.

Comparative Examples 1-C and 1-D are copper pastes where a glass frit having the same composition as the glass powder added in the production of ceramic green sheet and having a particle size of 800 nm was added in an amount of 1.0 part by mass or 5.0 part by mass.

Comparative Examples 2-B and 2-C are copper pastes where 1.0 part by mass or 3.0 parts by mass of a glass frit

TABLE 1

|  |  | Additive (1) | | Additive (2) | | | | | | |
|---|---|---|---|---|---|---|---|---|---|---|
|  |  | Additive | Particle Size of Additive (nm) | Amount of Additive Added (parts by mass) | Additive | Particle Size of Additive (nm) | Amount of Additive Added (parts by mass) | Amount of Fe | Protrusion | Coming Up of Glass | Airtight-ness |
| Example | 1-A | $Al_2O_3$ | 13 | 1.0 | none | — | — | 0 | 27 | none | bad |
|  | 1-B | $TiO_2$ | 21 | 1.0 | none | — | — | 0 | 22 | none | bad |
|  | 1-C | $SiO_2$ | 12 | 1.0 | none | — | — | 0 | 5 | none | bad |
|  | 1-D | $SiO_2$ | 12 | 0.2 | none | — | — | 0 | 25 | none | bad |
|  | 1-E | $SiO_2$ | 12 | 0.5 | none | — | — | 0 | 1 | none | bad |
|  | 1-F | $SiO_2$ | 12 | 2.0 | none | — | — | 0 | 7 | none | bad |
| Comparative | 1-A | none | — | — | none | — | — | 0 | 54 | none | bad |
| Example | 1-B | $Al_2O_3$ | 300 | 1.0 | none | — | — | 0 | 52 | none | bad |
|  | 1-C | glass | 800 | 1.0 | none | — | — | 0 | 19 | came up | bad |
|  | 1-D | glass | 800 | 5.0 | none | — | — | 0 | 2 | came up | good |
| Example | 2-A | $SiO_2$ | 12 | 0.5 | $Fe_2O_3$ | 21 | 0.5 | 0.4 | 7 | none | good |
|  | 2-B | $SiO_2$ | 12 | 0.5 | $Fe_2O_3$ | 21 | 1.0 | 0.7 | 8 | none | good |
|  | 2-C | $SiO_2$ | 12 | 0.5 | $Fe_2O_3$ | 21 | 2.0 | 1.4 | 8 | none | good |
|  | 2-D | $SiO_2$ | 12 | 0.5 | $Fe_2O_3$ | 21 | 5.0 | 3.5 | 10 | none | good |
|  | 2-E | $SiO_2$ | 12 | 0.5 | $Fe_2O_3$ | 21 | 10.0 | 7.0 | 18 | none | good |
|  | 2-F | $SiO_2$ | 12 | 0.5 | $Fe_2O_3$ | 21 | 0.2 | 0.1 | 12 | none | good |
|  | 2-G | None | — | — | $Fe_2O_3$ | 21 | 1.0 | 0.7 | 47 | none | good |
| Comparative | 2-B | $SiO_2$ | 12 | 0.5 | glass | 2.5 | 1.0 | 0 | 3 | came up | bad |
| Example | 2-C | $SiO_2$ | 12 | 0.5 | glass | 2.5 | 3.0 | 0 | 2 | came up | good |

As shown in Table 1, copper pastes having the compositions of Examples 1-A to 1-F and 2-A to 2-G were produced as Examples of the invention and also, copper pastes having the compositions of Comparative Examples 1-A to 1-D, 2-C and 2-D were produced for comparison with the effect of the invention.

A viscosity of the copper paste of Example 1-E was 800,000 poise (for reference, in case that 14 parts by mass having a particle size of 2.5 nm and 0.5 parts by mass of $SiO_2$ particle having an average particle size of 12 nm were added per 100 parts by mass of the copper powder. The glass frit used here had the same composition as the glass powder contained in the green sheet.

[Production of Fired Sample]

Using the thus-obtained green sheet and copper pastes, fired samples as the sample for evaluation were produced.

First, the ceramic green sheet was cut into a dimension of 50 mm (length)×60 mm (width) to prepare two ceramic green sheet strips and 100 via holes in total each having an inner diameter of 250 μm were punched in 10 rows and 10 lines at a pitch of 500 μm in the nearly center part of the ceramic green sheet strip.

Then, a thin-film metal screen where through-holes each having the same size as the inner diameter of via hole were formed was covered on the ceramic green sheet strip while registering the through-holes with the via holes and from the upper side of this metal screen, a copper paste was printed by a squeegee to fill the copper paste in the via holes.

Thereafter, the copper paste in the via hole was dried in a temperature atmosphere of nearly 100° C. and then two ceramic green sheets were stacked to lie one on another while aligning the centers of respective via holes and press-bonded to form a green sheet stacked body.

This green sheet stacked body was exposed in a furnace having prepared therein a mixed atmosphere of water vapor and nitrogen gas (dew point: 70° C.) and left standing at a temperature of 850° C. to degrease the organic components contained in the copper paste and ceramic green sheet stacked body. Subsequently, the temperature was elevated to 1,000° C. and the stacked body was left standing for 2 hours and thereby fired to produce a fired sample.

[Measurement of Protrusion Amount]

Using the fired sample obtained above, the protrusion dimension of the via conductor exposed and protruded from the fired sample surface was measured.

In the measurement of protrusion dimension of the via conductor, the top face of the ceramic layer 400 μm apart from the center of the via conductor was taken as the standard value and the maximum height of the protruded via conductor from the standard value was measured by a microscope. The results are shown in Table 1.

[Presence or Absence of Coming Up of Glass to Via Conductor Surface]

Using the fired sample obtained above, the surface of via conductor exposed to the fired sample surface was observed by a microscope at a magnification of 500 and the presence or absence of coming up of glass to the via conductor surface was inspected. The results are shown in Table 1.

[Evaluation of Airtightness]

The airtightness at the interface between the via conductor and the ceramic layer of the fired sample was measured by using a He leak detector.

In a sample vessel constituting the He leak detector, the fired sample was fixed and designed as the partition plate. The pressure in the lower side of this fired sample was reduced to 0.1 torr or less while filling He gas in the upper side and the amount of He gas leaking from the upper side to the lower side (through the interface between via conductor and ceramic layer) was measured. The sample of giving an He gas leakage amount of $1 \times 10^{-7}$ atm·ml/sec or less had no problem in practice and was rated good, whereas the sample exceeding $1 \times 10^{-7}$ atm·ml/sec was rated bad. The results obtained are shown in Table 1.

As seen from Table 1, in Examples 1-A to 1-F of the present invention, the protrusion amount of via conductor protruded from the fired sample surface is from 1 to 27 μm, the coming up of glass to the via conductor surface is not generated and therefore, a via conductor facilitated in the plating treatment and enabling the packaging of a circuit component with good precision can be obtained.

In Comparative Example 1-A, when compared with Examples 1-A to 1-F of the present invention, an additive is not added to the copper paste, as a result, the protrusion amount of via conductor is as large as 54 μm.

In Comparative Example 1-B, when compared with Example 1-A of the present invention, 1.0 part by mass of $Al_2O_3$ is added as the additive and the kind and amount added of the additive are the same as those of Example 1-A, however, the particle size is 300 nm and larger than the particle size of 13 nm in Example 1-A of the present invention, as a result, the protrusion amount of via conductor is as large as 52 μm.

In Comparative Examples 1-C and 1-D, when compared with Examples 1-A to 1-F of the present invention, a glass frit is added and thereby the protrusion amount of via conductor can be reduced to the same level as those of Examples 1-C, 1-E and 1-F of the present invention, however, coming up of glass to the via conductor surface is generated and the plating treatment becomes difficult. Incidentally, in Comparative Examples 1-C and 1-D, when the via conductor surface was enlarged and observed by a microscope, many inorganic matters composed of glass in a size of about 15 μm came up to the surface.

Among Examples of the present invention, when Example 1-C is compared with Examples 1-A and 1-B, the protrusion amount of Examples 1-A and 1-B is 27 μm and 22 μm, whereas in Example 1-C, the protrusion amount of via conductor is as small as 5 μm and the coming up of glass is not generated. From this, it is seen that the addition of $SiO_2$ as the ceramic particle is particularly preferred.

Furthermore, in Examples 1-C to 1-F, the same $SiO_2$ particle is added as the additive, however, the protrusion amount of via conductor is smaller in Examples 1-C, 1-E and 1-F as compared with Example 1-D and from this, it is seen that the amount of $SiO_2$ particle added is preferably from 0.5 to 2.0 parts by mass.

As seen from Table 1, in the fired samples produced by using copper pastes of Examples 2-A to 2-F of the present invention, the coming up of glass to the via conductor surface did not occur and the airtightness at the interface between via conductor and ceramic layer was good.

In Comparative Example 2-B, when compared with Examples 2-A and 2-B of the present invention, a glass frit was added to the copper paste in place of $Fe_2O_3$ particle, as a result, coming up of glass to the via conductor surface was generated to impair the plating property on the via conductor surface and at the same time, the airtightness was deteriorated.

In Comparative Example 2-C, when compared with Examples 2-D and 2-E of the present invention, 3.0 parts by mass of glass was added and thereby good airtightness could be attained, however, coming up of glass was generated and the plating property was impaired.

Incidentally, in Examples 2-A to 2-F of the present invention and Comparative Examples 2-B and 2-C, $SiO_2$ particle was added to the copper paste and therefore, protrusion of via conductor from the fired sample surface was not generated.

[Observation of Cross Section of Via Conductor]

Using the fired sample of Example 1-E of the present invention and the fired sample of Comparative Example 1-D, the cross section of via conductor was enlarged and observed by a microscope to examine the dispersion state of inorganic matter inside the via conductor.

Figure 2:
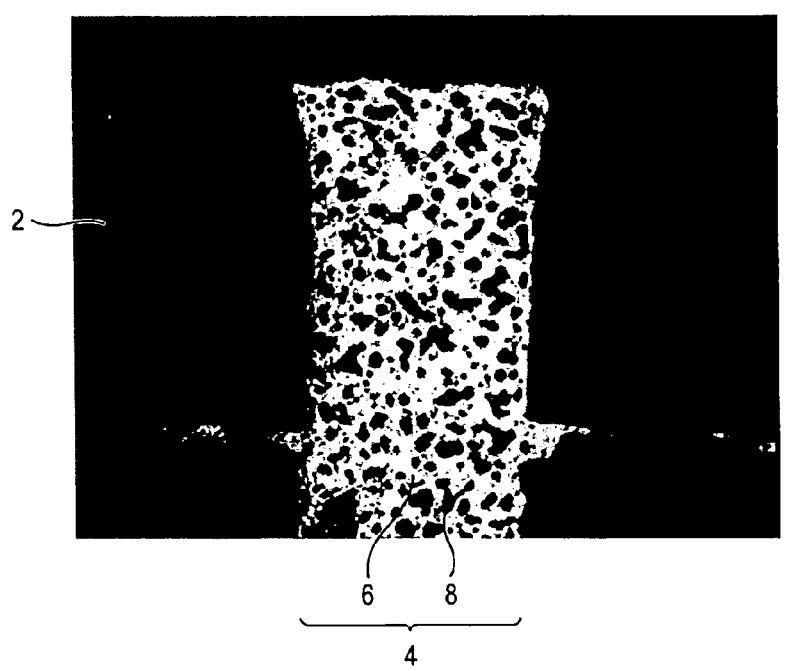
FIG. 2 is a cross-sectional view showing the cross section of a fired sample of Comparative Example.

FIG. 1 is a cross-sectional view showing the cross section of the fired sample of Example 1-E of the present invention and FIG. 2 is a cross-sectional view showing the cross section of the fired sample of Comparative Example 1-D.

In FIGS. 1 and 2, 1 and 2 are a ceramic porcelain, 3 and 4 are a via conductor, 5 and 6 are a fired copper, and 7 and 8 are an inorganic matter.

Using FIGS. 1 and 2, the cross section of via conductor is compared between Example 1-E of the present invention and Comparative Example 1-D. In Example 1-E of the present invention shown in FIG. 1, the inorganic matter 7 contained in the via conductor 3 is as small as about 5 μm or less and uniformly dispersed and the copper 5 is fired to a dense sintered crystal. On the other hand, in Comparative Example 1-D shown in FIG. 2, an inorganic matter 8 of about 15 μm is dispersed in the via conductor 4 and the sintered structure of copper 6 is coarse. From this, it is seen that according to Example 1-E of the present invention, an inorganic matter 7 is finely dispersed in a via conductor 3 and a densely fired via conductor 3 can be obtained.

Embodiment 2

The ceramic green sheet of Embodiment 1 was used and a through-hole having a diameter of 250 μm was formed on the ceramic green sheet.

Then, the copper paste of Example 1-E of the present invention and the copper paste of Comparative Example 1-D each was filled in a via hole of the ceramic green sheet and dried and thereafter, a copper paste was printed on the ceramic green sheet surface to form a wiring pattern.

Subsequently, a plurality of the ceramic green sheets were stacked and pressed to produce a green sheet stacked body. This green sheet stacked body was exposed in a furnace having prepared therein a mixed atmosphere of water vapor and nitrogen gas and left standing at a temperature of 850° C. to degrease the organic components contained in the copper paste and ceramic green sheet. After displacement with a dry nitrogen gas, the stacked body was left standing at a temperature of 1,000° C. for 2 hours and thereby fired.

Then, Ni was plated on the surface of the via conductor exposed to the surface of this wiring board and Au was further plated on the top face of Ni to form a circular shape having a diameter of 80 μm, thereby producing a wiring board.

The surface of the obtained wiring board was observed, as a result, in the wiring board produced using the copper paste of Example 1-E of the present invention, a circular Au plating layer having a diameter of 80 μm was formed on the via conductor surface with good precision and the plating was free of unevenness and good. On the other hand, in the wiring board using the copper paste of Comparative Example 1-D, glass came up to the via conductor surface and plating could not be performed.

Thereafter, the wiring boards produced using the copper paste of Example 1-E or Comparative Example 1-D each was cut, the cut face was polished, the cross section of the via conductor was observed by SEM (scanning-type electron microscope) and a reflection electron composition image was obtained. Based on the reflection electron composition image, inorganic matters having a particle size of 2 μm or more, 5 μm or more, and 10 μm or more, present in an arbitrary sectional area of 4,000 μm² of the via conductor were detected. In the reflection electron composition image, the bright part (white portion) shows heavy elements such as Cu and the dark part (black portion) shows the inorganic matter. The ratio of the total area of the inorganic matter (dark part) to the sectional area of the via conductor was calculated by the image processing, as a result, in Example E, the ratio of the inorganic matter having a particle size of 2 μm or more was 1.9% and the ratio of the inorganic matter having a particle size of 5 μm or more was 0%. In Comparative Example D, the ratio of the inorganic matter having a particle size of 2 μm or more was 29.5%, the ratio of the inorganic matter having a particle size of 5 μm or more was 26.6%, and the ratio of the inorganic matter having a particle size of 10 μm or more was 15.0%.

Therefore, the total area of the inorganic matter having each particle size or more in the sectional area of the via conductor was calculated and at the same time, the plating property on the via conductor surface was evaluated. As a result, when the total area ratio of the inorganic matter having each particle size or more to the sectional area of the via conductor was 10% or less in the case of a particle size of 2 μm or more, 5% or less in the case of a particle size of 5 μm or more, and 2% or less in the case of a particle size of 10 μm or more, even if a part of the inorganic matter was exposed to the via conductor surface, the via conductor surface was not impaired in the plating property and could be easily plated.

Embodiment 3

Using the ceramic green sheet produced in Embodiment 1 and the copper pastes of Examples 2-B and 2-E of the present invention and Comparative Example 2-C, each copper paste was filled in via holes formed on the ceramic green sheet and dried. In this way, 5 sheets of Ceramic Green Sheet Example 2-B filled with the copper paste of Example 2-B, 5 sheets of Ceramic Green Sheet Example 2-E filled with the copper paste of Example 2-E, and 5 sheets of Ceramic Green Sheet Comparative Example 2-C filled with the copper paste of Comparative Example 2-C were produced.

Subsequently, the copper paste filled in via holes was dried in a temperature atmosphere of nearly 100° C. and on the top surface of the ceramic green sheet, a copper paste for the formation of a wiring pattern was printed and dried.

Thereafter, respective 5 sheets of Ceramic Green Sheet Example 2-B, Ceramic Green Sheet Example 2-E and Ceramic Green Sheet Comparative Example 2-C were stacked and press-bonded to produce Green Sheet Stacked Body Example 2-B, Green Sheet Stacked Body Example 2-E and Green Sheet Stacked Body Comparative Example 2-C. Each green sheet stacked body was exposed in a furnace having prepared therein a mixed atmosphere of water vapor and nitrogen gas, left standing and thereby degreased at a temperature of 850° C., and then left standing and thereby fired at a temperature of 1,000° C. for 2 hours to produce wiring boards of Examples 2-B and 2-E and Comparative Example 2-C.

Then, Ni was plated on the via conductor exposed to the top surface of each wiring board and Au was further plated on the top face of Ni.

The via conductor surface of the thus-obtained wiring boards of Examples 2-B and 2-E and Comparative Example 2-C was observed, as a result, in the wiring boards of Examples 2-B and 2-E of the present invention, the Au plating part was free of plating unevenness and no inorganic matter remained on the plating surface, revealing these wiring boards were good. On the other hand, in the wiring board of Comparative Example 2-C, glass heavily came up to the via conductor surface, therefore, plating of Ni and Au was difficult and serious plating unevenness or plating failure was generated.

When the wiring boards of Examples 2-B and 2-E of the present invention were compared, in the wiring board of Example 2-B, the amount of Fe element contained in the via conductor is small, therefore, the internal resistance of via conductor was lower, the high-frequency signal transmission loss was reduced and excellent high-frequency properties were obtained.

Embodiment 4

Using the ceramic green sheet produced in Embodiment 1 and the copper paste having the composition of Example 1-E of Embodiment 1, a wiring board having mounted thereon a semiconductor element was produced.

Figure 3:
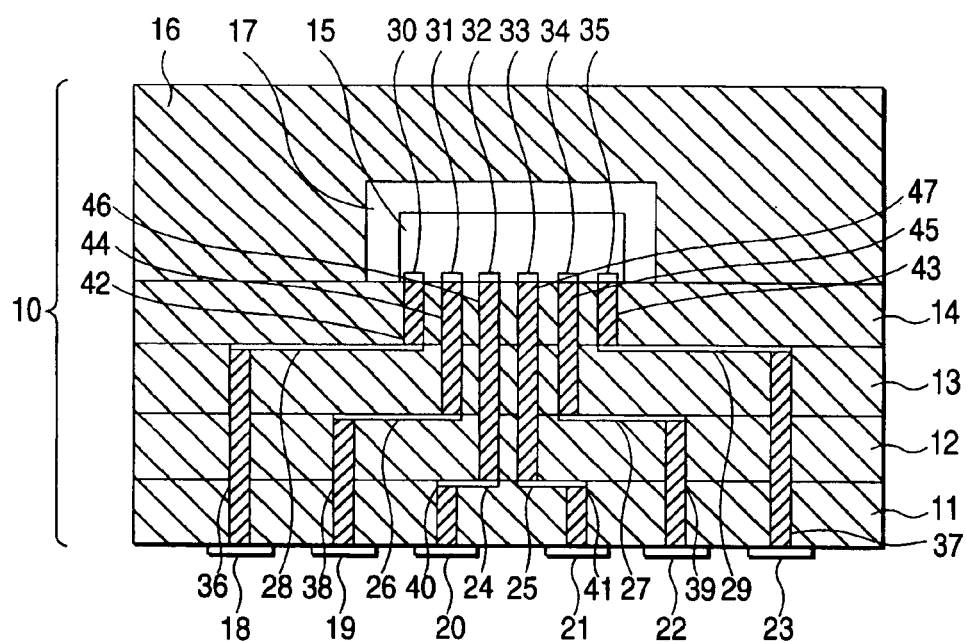
FIG. 3 is a cross-sectional view showing the structure of a wiring board in one embodiment where the present invention is applied.

FIG. 3 is a cross-sectional view showing the structure of a wiring board in the embodiment where the present invention is applied.

In FIG. 3, 10 is a wiring board and this wiring board 10 is constituted by ceramic layers 11 to 14 formed by stacking a plurality of ceramic green sheets and firing the sheets, a semiconductor element 15 disposed on the top face of the ceramic layers 11 to 14, and a cover 16 housing the semiconductor element 15 in a hole 17 and joined at the peripheral surface thereof with the ceramic layer 14 by a brazing material (not shown).

In the ceramic layers 11 to 14, inside conductor layers 24 to 29 are formed on respective superposed surfaces. These inside conductor layers 24 to 29 are connected to via conductors 36 to 47 formed to piece the ceramic layers 11 to 14.

On the bottom surface of the ceramic layer 11, circuit terminals 18 to 23 are formed to connect with via conductors 36 to 41, respectively. These circuit terminals 18 to 23 are formed by printing a copper paste on respective exposed faces of via conductors 36 to 41, performing simultaneous firing, applying Ni plating to each conductor surface and then applying Au plating on each Ni plating surface. On the top surface of the ceramic layer 14, plating layers 30 to 35 are formed to connect with via conductors 42 to 47, respectively. These plating layers 30 to 35 are formed by applying Ni plating to respective exposed faces of via conductors 42 to 47 and applying Au plating on each Ni plating surface. The terminal (not shown) of the semiconductor element 15 is connected by soldering to lie over the plating layers 30 to 35.

As such, in the wiring board 10, the circuit terminals 18 to 23 on the bottom ceramic layer 11 are connected to the plating layers 30 to 35 on the top ceramic layer 14 through via conductors 36 to 47, inside electrodes 24 to 29 and the like, and connected to the terminal of the semiconductor element 15 through the plating layers 30 to 35, thereby constituting an electrical circuit.

In the thus-obtained wiring board 10, the via conductors 36 to 47 were densely fired and had a low electric resistance and the semiconductor element 15 was reduced in the dispersion or deterioration of electrical properties. Furthermore, the via conductors 36 to 47 were less protruded from the wiring board 10 to facilitate the plating treatment and good plating layers could be obtained.

The via conductors 36 to 47 had good heat conductivity and the semiconductor element 15 could be reduced in the elevation of temperature.

The operational effects of the copper paste and wiring board according to the embodiment of the present invention having the above-described constitutions are described below.

When the copper paste according to the embodiment of the present invention is filled in a via hole formed on a ceramic green sheet and fired, the adhesion between the ceramic layer and the via conductor is enhanced and a wiring board free of clearance can be obtained.

When the copper paste according to the embodiment of the present invention is filled in a via hole of a ceramic green sheet, once exposed in a wet nitrogen atmosphere and then fired, the protrusion of via conductor is reduced, the coming up of glass to the via conductor surface is not generated, thereby facilitating the plating treatment, and a via conductor enabling the packaging of a circuit component with good precision can be obtained.

When the copper paste according to the embodiment of the present invention is filled in a via hole of a ceramic green sheet, once exposed in a wet nitrogen atmosphere and then fired, a dense via conductor having a low resistance is obtained and a wiring board reduced in the transmission loss of high-frequency signal can be obtained.

In the wiring board according to the embodiment of the present invention, a good plating layer free of plating unevenness, defect and separation is formed on the via conductor surface and therefore, an electric circuit having excellent durability such as temperature load, humidity load and heat load can be formed.

In the wiring board according to the embodiment of the present invention, the via conductor is low in the electric resistance and when the terminal of a semiconductor element is connected through the surface plating layer of this via conductor, an electric circuit free from dispersion or deterioration in the electrical properties of the semiconductor can be formed.

In the wiring board according to the embodiment of the present invention, the via conductor is densely fired and has high heat conductivity and therefore, when the via conductor is constituted as a thermal via in a wiring board stacked to a high density, an excellent heat radiation effect is provided.

In the embodiment of the present invention, the conductor layer is formed by plating Ni on the top face of copper and plating Au further on the top face of Ni plating, however, other metal having a low resistance may be plated on the top face of copper.

In the embodiment of the present invention, the electrically conducting paste is filled in a via hole piecing the ceramic green sheet to form a via conductor, however, when a groove is formed on the end face of the wiring board in place of the via hole and the electrically conducting paste of the present invention is filled in the groove to form a connection conductor of a wiring pattern, this connection conductor is less protruded from the wiring board and a dense connection conductor having a low resistance is obtained, therefore, this is suitable for the formation of various electric circuits.

The copper paste of the present invention preferably contains no glass frit, because if contained, the plating property of the via conductor is impaired, however, according to the pattern design of wiring board, a slight amount of glass may be contained to an extent of not impairing the soldering or plating property.

This application is based on Japanese Patent application JP 2002-208322, filed Jul. 17, 2002, and Japanese Patent application JP 2002-208323, filed Jul. 17, 2002, the entire contents of those are hereby incorporated by reference, the same as if set forth at length.

What is claimed is:

1. A wiring board obtained by filling a copper paste in a via hole formed on a ceramic green sheet and firing it to form an insulating layer and a via conductor, the copper paste comprising a copper powder, an organic vehicle, a ceramic particle having an average particle size of 100 nm or less and an $Fe_2O_3$ particle, wherein the copper paste comprises from 6 to 20 parts by mass of the organic vehicle per 100 parts by mass of the copper powder.

2. A wiring board obtained by filling a copper paste in a via hole formed on a ceramic green sheet and firing it to form an insulating layer and a via conductor, the copper paste comprising a copper powder, an organic vehicle and a ceramic particle having an average particle size of 50 nm or less, wherein the copper paste comprises from 6 to 20 parts by mass of the organic vehicle per 100 parts by mass of the copper powder.

3. A wiring board obtained by filling a copper paste in a via hole formed on a ceramic green sheet and firing it to form an insulating layer and a via conductor, the copper paste comprising a copper powder, an organic vehicle and an $Fe_2O_3$ particle in an amount of from 0.1 to 5.0 parts by mass, wherein the copper paste comprises from 6 to 20 parts by mass of the organic vehicle per 100 parts by mass of the copper powder.

4. The wiring board according to claim 1, wherein the via conductor comprises an inorganic matter comprising constituents of the ceramic particle and having a size of 10 $\mu$m or less after firing, said size being a long diameter thereof where the inorganic matter has a spherical or near spherical shape or an equivalent diameter where the inorganic matter has an amorphous shape.

5. The wiring board according to claim 1, wherein the via conductor is exposed to at least one surface of the wiring board and an inorganic matter comprising constituents of the ceramic particle and having a size of 10 $\mu$m or less after firing is revealed on the exposed face of the via conductor, said size being a long diameter thereof where the inorganic matter has a spherical or near spherical shape or an equivalent diameter where the inorganic matter has an amorphous shape.

6. The wiring board according to claim 1, wherein the via conductor is exposed to at least one surface of the wiring board and a plating layer is provided on the exposed face of the via conductor.

7. The wiring board according to claim 6, wherein a semiconductor element is mounted on the wiring board and a terminal of the semiconductor element is connected to the via conductor through a joining member.

8. The wiring board according to claim 1, wherein the via conductor is constituted as a thermal via working out to a heat conduction path.

9. A wiring board obtained by filling a copper paste in a via hole formed in a ceramic green sheet and firing to form an insulating layer and a via conductor, said via conductor having inside thereof an inorganic matter having a size of 10 $\mu$m or less after firing, said size being a long diameter thereof where the inorganic matter has a spherical or near spherical shape or an equivalent diameter where the inorganic matter has an amorphous shape.

10. The wiring board according to claim 9, wherein the via conductor is exposed to at least one surface of the wiring board and an inorganic matter having a size of 10 $\mu$m or less after firing is revealed on the exposed face of the via conductor.

11. The wiring board according to claim 9, wherein the via conductor is exposed to at least one surface of the wiring board and a plating layer is provided on the exposed face of the via conductor.

12. The wiring board according to claim 11, wherein a semiconductor element is mounted on the wiring board and a terminal of the semiconductor element is connected to said via conductor through a joining member.

13. The wiring board according to claim 9, wherein the via conductor is constituted as a thermal via working out to a heat conduction path.

14. The wiring board according to claim 1, wherein the via conductor comprises less than 5.0 parts by mass of an Fe element per 100 parts by mass of the copper element.

15. A wiring board obtained by filling a copper paste in a via hole formed in a ceramic green sheet and firing to form an insulating layer and a via conductor, said via conductor having dispersed therein an inorganic matter, wherein in a cross section in a thickness direction of the wiring board, a total area of the inorganic matter having a particle size of 2 $\mu$m or more after firing is 10% or less of the sectional area of the via conductor.

16. A wiring board obtained by filling a copper paste in a via hole formed in a ceramic green sheet and firing to form an insulating layer and a via conductor, said via conductor having dispersed therein an inorganic matter, wherein in a cross section in a thickness direction of the wiring board, a total area of the inorganic matter having a particle size of 5 $\mu$m or more after firing is 5% or less of the sectional area of the via conductor.

17. A wiring board obtained by filling a copper paste in a via hole formed in a ceramic green sheet and firing to form an insulating layer and a via conductor, said via conductor having dispersed therein an inorganic matter, wherein in a-cross section in a thickness direction of the wiring board, a total area of the inorganic matter having a particle size of 10 $\mu$m or more after firing is 2% or less of the sectional area of the via conductor.

18. A copper paste comprising a copper powder, an organic vehicle, a ceramic particle having an average particle size of 100 nm or less; and an $Fe_2O_3$ particle, wherein the copper paste comprises from 6 to 20 parts by mass of the organic vehicle per 100 parts by mass of the copper powder.

19. The copper paste according to claim 18, wherein the ceramic particle is an $SiO_2$ particle having an average particle size of 100 nm or less.

20. The copper paste according to claim 18, wherein the ceramic particle has an average particle size of 50 nm or less.

21. The wiring board according to claim 1, wherein said copper paste does not contain glass frit.

22. A copper paste comprising a copper powder, an organic vehicle and a ceramic particle having an average particle size of 50 nm or less, wherein the copper paste comprises from 6 to 20 parts by mass of the organic vehicle per 100 parts by mass of the copper powder.

23. A copper paste comprising a copper powder, an organic vehicle and an $Fe_2O_3$ particle in an amount of from 0.1 to 5.0 parts by mass, wherein the copper paste comprises from 6 to 20 parts by mass of the organic vehicle per 100 parts by mass of the copper powder.

24. A copper paste comprising a copper powder, an organic vehicle, a ceramic particle having an average particle size of 100 nm or less and an $Fe_2O_3$ particle, wherein the copper paste has a viscosity of 5,000 to 1,000,000 poises.

25. A copper paste comprising a copper powder, an organic vehicle and a ceramic particle having an average particle size of 50 nm or less, wherein the copper paste has a viscosity of 5,000 to 1,000,000 poises.

26. A copper paste comprising a copper powder, an organic vehicle and an $Fe_2O_3$ particle in an amount of from 0.1 to 5.0 parts by mass, wherein the copper paste has a viscosity of 5,000 to 1,000,000 poises.

* * * * *